United States Patent
Tanaka et al.

(10) Patent No.: US 11,782,104 B2
(45) Date of Patent: *Oct. 10, 2023

(54) MAGNETIC FIELD DETECTION DEVICE

(71) Applicant: TDK CORPORATION, Tokyo (JP)

(72) Inventors: Yoshiaki Tanaka, Tokyo (JP); Tetsuya Hiraki, Tokyo (JP); Kazuya Watanabe, Tokyo (JP); Suguru Watanabe, Tokyo (JP)

(73) Assignee: TDK CORPORATION, Tokyo (JP)

( * ) Notice: Subject to any disclaimer, the term of this patent is extended or adjusted under 35 U.S.C. 154(b) by 116 days.

This patent is subject to a terminal disclaimer.

(21) Appl. No.: 17/366,622

(22) Filed: Jul. 2, 2021

(65) Prior Publication Data

US 2021/0333336 A1 Oct. 28, 2021

Related U.S. Application Data

(63) Continuation-in-part of application No. 15/919,530, filed on Mar. 13, 2018, now Pat. No. 11,054,490.

(30) Foreign Application Priority Data

Mar. 27, 2017 (JP) .................................. 2017-061634

(51) Int. Cl.
*G01R 33/09* (2006.01)
(52) U.S. Cl.
CPC ......... *G01R 33/093* (2013.01); *G01R 33/098* (2013.01)
(58) Field of Classification Search
CPC ............................ G01R 33/093; G01R 33/098
See application file for complete search history.

(56) References Cited

U.S. PATENT DOCUMENTS

| | | | |
|---|---|---|---|
| 7,826,254 B2 | 11/2010 | Haratani et al. | |
| 7,848,059 B2 | 12/2010 | Yoshikawa et al. | |
| 8,378,674 B2 | 2/2013 | Furukawa et al. | |
| 8,780,506 B1 * | 7/2014 | Maat .................... | G11B 5/3912 |
| | | | 360/319 |
| 9,042,059 B1 | 5/2015 | Katine et al. | |
| 11,054,490 B2 * | 7/2021 | Tanaka ................... | H10N 50/10 |

(Continued)

FOREIGN PATENT DOCUMENTS

| | | |
|---|---|---|
| CN | 1707617 A | 12/2005 |
| CN | 101154707 A | 4/2008 |

(Continued)

*Primary Examiner* — Paresh Patel
(74) *Attorney, Agent, or Firm* — Oliff PLC

(57) ABSTRACT

A magnetic field detection device includes a base, a first yoke, and a magneto-resistive effect element. The first yoke is provided on the base, and includes first and second principal surfaces each extending along a first plane, and a first end surface coupling the first and second principal surfaces. The magneto-resistive effect element is provided on the base, and includes a magnetization free layer disposed at a position overlapped with the first yoke in a first direction along the first plane. The first end surface includes an inverted tapered surface inclined relative to the first plane and extending closer to a center point of the magnetization free layer as being away from the base in a second direction orthogonal to the first plane. A distance from the center point to a first edge is shorter than a distance from the center point to a second edge.

12 Claims, 8 Drawing Sheets

(56) References Cited

U.S. PATENT DOCUMENTS

2005/0270702 A1 12/2005 Komagaki et al.
2008/0239585 A1 10/2008 Ousugi et al.
2011/0215800 A1 9/2011 Zhou et al.

FOREIGN PATENT DOCUMENTS

JP 2002-319110 A 10/2002
WO 2006/057379 A1 6/2006
WO 2008/146809 A1 8/2010

* cited by examiner

MAGNETIC FIELD DETECTION DEVICE

CROSS REFERENCE TO RELATED APPLICATIONS

This application is a continuation-in-part of U.S. application Ser. No. 15/919,530, filed Mar. 13, 2018, the contents of which are incorporated herein by reference. This application claims the benefit of Japanese Priority Patent Application JP2017-061634 filed on Mar. 27, 2017, the entire contents of which are incorporated herein by reference.

BACKGROUND

The disclosure relates to a magnetic field detection device that detects a magnetic field by means of a magnetism detection element.

As a magnetic field detection device that detects an external magnetic field, a magnetic field detection device utilizing a Hall element or a magneto-resistive effect element has been known. For example, reference is made to International Publication No. WO 2008/146809.

SUMMARY

Incidentally, in recent years, it has been requested to improve a performance of detecting a magnetic field.

It is desirable to provide a magnetic field detection device having a more superior magnetic field detection performance.

A magnetic field detection device according to an embodiment of the disclosure includes: a base; a first yoke provided on the base, and including a first principal surface that extends along a first plane, a second principal surface that extends along the first plane, and a first end surface that couples the first principal surface and the second principal surface; and a magneto-resistive effect element provided on the base, and including a magnetization free layer that is disposed at a position overlapped with the first yoke in a first direction along the first plane. The first end surface includes an inverted tapered surface. The inverted tapered surface extends closer to a center point of the magnetization free layer as being away from the base in a second direction orthogonal to the first plane, and is inclined relative to the first plane. A distance from the center point of the magnetization free layer to a first edge is shorter than a distance from the center point of the magnetization free layer to a second edge. The first edge is a location at which the first principal surface and the first end surface intersect each other, and the second edge is a location at which the second principal surface and the first end surface intersect each other.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the disclosure.

DETAILED DESCRIPTION

Figure 1:
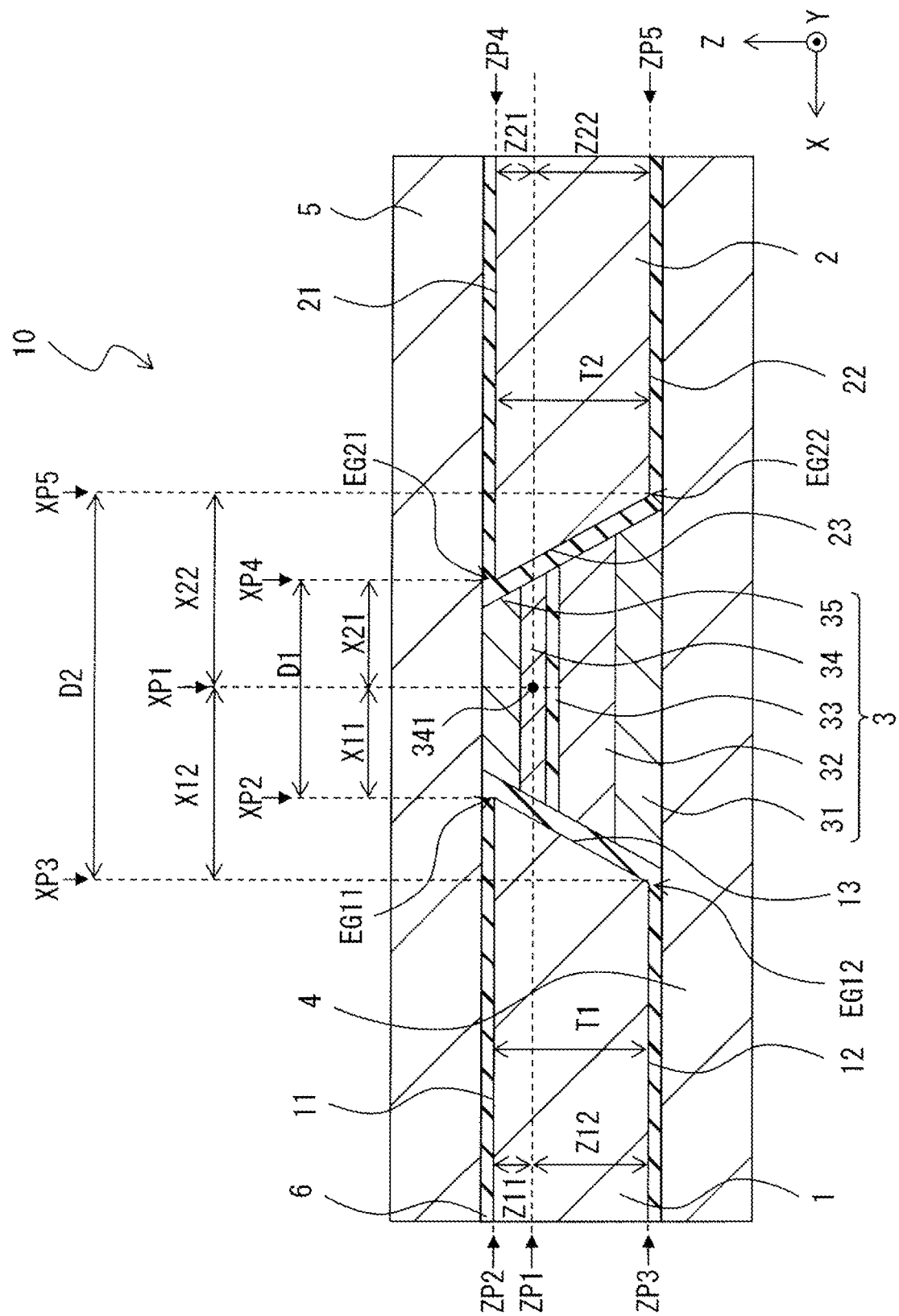
FIG. 1 is a schematic cross-sectional view of an overall configuration of a magnetic field detection device according to one example embodiment of the disclosure.

Some embodiments of the disclosure are described below in detail with reference to the accompanying drawings. It is to be noted that the following description is directed to illustrative examples of the technology and not to be construed as limiting to the technology. Factors including, without limitation, numerical values, shapes, materials, components, positions of the components, and how the components are coupled to each other are illustrative only and not to be construed as limiting to the technology. Further, elements in the following example embodiments which are not recited in a most-generic independent claim of the technology are optional and may be provided on an as-needed basis. The drawings are schematic and are not intended to be drawn to scale. It is to be noted that the like elements are denoted with the same reference numerals, and any redundant description thereof will not be described in detail. It is to be noted that the description is given in the following order.

1. First Example Embodiment

An example of a magnetic field detection device including a pair of soft magnetic layers and a magnetism detection element disposed therebetween.

2. Second Example Embodiment

An example of a magnetic field detection device including additional soft magnetic layers at positions that overlap a pair of soft magnetic layers in a layer-stacking direction.

3. Other Modification Examples

1. First Example Embodiment

[Overall Configuration of Magnetic Field Detection Device 10]

First, a description is given, with reference to FIG. 1, of a configuration of a magnetic field detection device 10 according to a first example embodiment of the disclosure. FIG. 1 is a schematic cross-sectional view of an overall configuration example of the magnetic field detection device 10.

The magnetic field detection device 10 may be a device that detects presence or absence, direction, and intensity of an external magnetic field reaching itself, and may be mounted on an electronic compass, for example. Here, a direction of a magnetic field to be detected such as the external magnetic field, for example, may be substantially coincident with an X-axis direction, in one embodiment. The magnetic field detection device 10 may include a soft magnetic layer 1 as a first yoke, a soft magnetic layer 2 as a second yoke, and a magneto-resistive effect (MR) element 3 that exhibits a resistance change depending on a direction and intensity of the external magnetic field, for example. Hereinafter, the magneto-resistive effect element 3 is referred to as an MR element 3. The magnetic field detection device 10 may further include a bottom electrode layer 4 and a top electrode layer 5 that supply a sense current to the MR element 3. An insulating layer 6 may be provided between the soft magnetic layer 1 and the MR element 3, between the soft magnetic layer 1 and the bottom electrode layer 4, and between the soft magnetic layer 1 and the top electrode layer 5. In addition, the insulating layer 6 may be provided between the soft magnetic layer 2 and the MR element 3, between the soft magnetic layer 2 and the bottom electrode layer 4, and between the soft magnetic layer 2 and the top electrode layer 5.

The X-axis direction is a specific but non-limiting example corresponding to a "first direction" in an embodiment of the disclosure, and a Z-axis direction is a specific but non-limiting example corresponding to a "second direction" in an embodiment of the disclosure. An X-Y plane is a specific but non-limiting example corresponding to a "first plane" in an embodiment of the disclosure. Further, as used herein, the Z-axis direction may be sometimes referred to as a thickness direction. Furthermore, the bottom electrode layer 4 is a specific but non-limiting example corresponding to a "base" in an embodiment of the disclosure.

[Soft Magnetic Layer 1]

The soft magnetic layer 1 includes a principal surface 11 that extends along the X-Y plane, a principal surface 12 that extends along the X-Y plane, and an inclined surface 13 that couples the principal surface 11 and the principal surface 12 and is inclined relative to the X-Y plane. The soft magnetic layer 1 may have an overhang shape. The inclined surface 13 may be an inverted tapered surface that extends closer to a later-described center point 341 of a later-described magnetization free layer 34 of the MR element 3 as being toward the top electrode layer 5 from the bottom electrode layer 4 as the base. In particular, in the present example embodiment, the inclined surface 13 may extend to overhang the MR element 3. A part of the soft magnetic layer 1 and a part of the MR element 3 (i.e., a part of the magnetization free layer 34 described later) may overlap each other in a thickness direction. The principal surface 11 and the inclined surface 13 intersect each other at an edge EG11, and the principal surface 12 and the inclined surface 13 intersect each other at an edge EG12. The soft magnetic layer 1 may include, for example, a soft magnetic metal material having high saturation magnetic flux density, such as a nickel-iron alloy (NiFe). The soft magnetic layer 1 may be disposed at a position overlapped with the magnetization free layer 34 described later in the X-axis direction. Here, the principal surface 11 is a specific but non-limiting example corresponding to a "first principal surface" in an embodiment of the disclosure, and the principal surface 12 is a specific but non-limiting example corresponding to a "second principal surface" in an embodiment of the disclosure. The inclined surface 13 is a specific but non-limiting example corresponding to a "first end surface" in an embodiment of the disclosure. Further, the edge EG11 is a specific but non-limiting example corresponding to a "first edge" in an embodiment of the disclosure, and the edge EG12 is a specific but non-limiting example corresponding to a "second edge" in an embodiment of the disclosure.

[Soft Magnetic Layer 2]

The soft magnetic layer 2 includes a principal surface 21 that extends along the X-Y plane, a principal surface 22 that extends along the X-Y plane, and an inclined surface 23 that couples the principal surface 21 and the principal surface 22 and is inclined relative to the X-Y plane. Similarly to the soft magnetic layer 1, the soft magnetic layer 2 may have an overhang shape. The inclined surface 23 may be an inverted tapered surface that extends closer to the later-described center point 341 of the later-described magnetization free layer 34 of the MR element 3 as being toward the top electrode layer 5 from the bottom electrode layer 4 as the base. In particular, in the present example embodiment, the inclined surface 23 may extend to overhang the MR element 3. A part of the soft magnetic layer 2 and a part of the MR element 3 (i.e., a part of the magnetization free layer 34 described later) may overlap each other in the thickness direction. The principal surface 21 and the inclined surface 23 intersect each other at an edge EG21. The principal surface 22 and the inclined surface 23 intersect each other at an edge EG22. Similarly to the soft magnetic layer 1, the soft magnetic layer 2 may include, for example, a soft magnetic metal material having high saturation magnetic flux density, such as a nickel-iron alloy (NiFe). It is to be noted that a constituent material of the soft magnetic layer 1 and a constituent material of the soft magnetic layer 2 may be substantially the same as each other, or may be different from each other. The soft magnetic layer 2 may be disposed on side opposite to the soft magnetic layer 1 in the X-axis direction, as viewed from the MR element 3. Further, the soft magnetic layer 2 may be disposed at a position overlapped with the magnetization free layer 34 described later in the X-axis direction. Here, the principal surface 21 is a specific but non-limiting example corresponding to a "third principal surface" in an embodiment of the disclosure, and the principal surface 22 is a specific but non-limiting example corresponding to a "fourth principal surface" in an embodiment of the disclosure. The inclined surface 23 is a specific but non-limiting example corresponding to a "second end surface" in an embodiment of the disclosure. Further, the edge EG21 is a specific but non-limiting example corresponding to a "third edge" in an embodiment of the disclosure, and the edge EG22 is a specific but non-limiting example corresponding to a "fourth edge" in an embodiment of the disclosure.

[MR Element 3]

The MR element 3 may be, for example, a CPP (current perpendicular to plane) MR element having a spin-valve structure in which a plurality of functional films including a magnetic layer are stacked. A sense current flows in a layer-stacking direction in which the functional films are stacked inside the MR element 3. In a specific but non-limiting example, as illustrated in FIG. 1, the MR element 3 may include a stacked body in which an antiferromagnetic layer 31, a magnetization pinned layer 32, an intermediate layer 33, a magnetization free layer 34, and a protective layer 35 are stacked in order. The magnetization pinned layer 32 has magnetization pinned in a certain direction. The intermediate layer 33 does not exhibit a specific magnetization direction. The magnetization free layer 34 has magnetization varying in accordance with an external magnetic field. It is to be noted that the antiferromagnetic layer 31, the magnetization pinned layer 32, the intermediate layer 33, the magnetization free layer 34, and the protective layer 35 may each have a single-layer structure or a multi-layer structure configured by a plurality of layers. In such an MR element, the resistance change may occur in accordance with a change in the magnetic flux along a film plane (X-Y plane) orthogonal to the layer-stacking direction (e.g., Z-axis direction).

The antiferromagnetic layer 31 may include an antiferromagnetic material such as a platinum-manganese alloy (PtMn) and an iridium-manganese alloy (IrMn). The antiferromagnetic layer 31 is in a state, for example, in which a spin magnetic moment in a direction substantially the same as an orientation of the magnetization of the adjacent magnetization pinned layer 32 and a spin magnetic moment in a direction directly opposite thereto completely cancel each other. The antiferromagnetic layer 31 serves to fix the orientation of the magnetization of the magnetization pinned layer 32 into a certain direction.

The magnetization pinned layer 32 may include, for example, a ferromagnetic material such as cobalt (Co), a cobalt-iron alloy (CoFe), and a cobalt-iron-boron alloy (CoFeB). For example, the magnetization direction of the magnetization pinned layer 32 may be coincident with the X-axis direction, in one embodiment.

In a case where the MR element 3 is a magnetic tunneling junction (MTJ) element, the intermediate layer 33 may be a non-magnetic tunnel barrier layer including a magnesium oxide (MgO), for example. The intermediate layer 33 may have a thickness that is thin to the extent that a tunnel current based on quantum mechanics is able to pass therethrough. The tunnel barrier layer including MgO may be obtained by a process such as a process of oxidizing a thin film including magnesium (Mg) and a reactive sputtering process in which sputtering of magnesium is performed under an oxygen atmosphere, besides a sputtering process that uses a target including MgO, for example. It is also possible to configure the intermediate layer 33 with use of an oxide or a nitride of each of aluminum (Al), tantalum (Ta), and hafnium (Hf), besides MgO. In a case where the MR element 3 is a giant magnetoresistive (GMR) element, for example, the intermediate layer 33 may include a non-magnetic highly-electroconductive material such as copper (Cu), ruthenium (Ru) and gold (Au).

The magnetization free layer 34 may be disposed at a position overlapped with both of the soft magnetic layer 1 and the soft magnetic layer 2 in the X-axis direction. The magnetization free layer 34 may be a soft ferromagnetic layer, and may have, for example, a magnetization easy axis substantially orthogonal to the orientation of the magnetization of the magnetization pinned layer 32. The magnetization free layer 34 may include, for example, a material such as a cobalt-iron alloy (CoFe), a nickel-iron alloy (NiFe), and a cobalt-iron-boron alloy (CoFeB). For example, the direction of the magnetization easy axis of the magnetization free layer 34 may be coincident with a Y-axis, in one embodiment.

The protective layer 35 may include, for example, a non-magnetic electroconductive material such as tantalum (Ta).

[Bottom Electrode layer 4 and Top Electrode Layer 5]

The bottom electrode layer 4 may extend on the X-Y plane to come into contact with a part (e.g., an undersurface of the antiferromagnetic layer 31) of the MR element 3. The top electrode layer 5 may extend on the X-Y plane to come into contact with any other part (e.g., a top surface of the magnetization free layer 34) of the MR element 3. The bottom electrode layer 4 and the top electrode layer 5 may each include, for example, a non-magnetic highly-electroconductive material such as copper (Cu) and aluminum (Al).

[Signal Detection Circuit]

Figure 2:
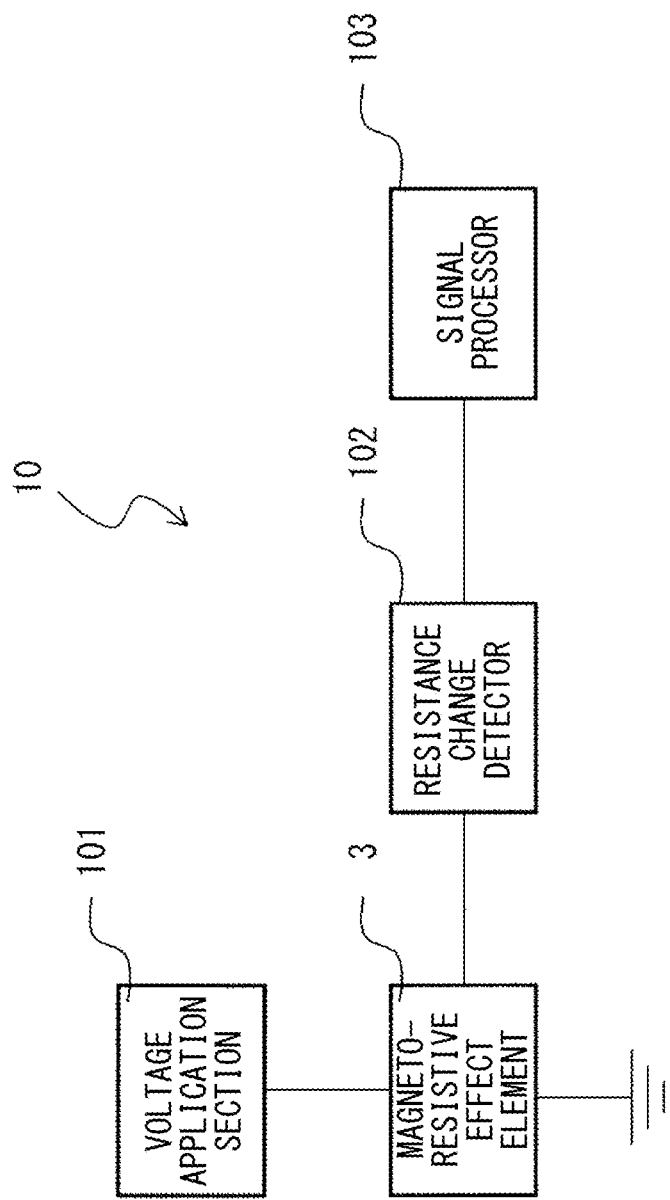
FIG. 2 is a circuit diagram illustrating an example of a signal detection circuit to be mounted on the magnetic field detection device illustrated in FIG. 1.

The magnetic field detection device 10 may include, for example, a signal detection circuit illustrated in FIG. 2. The signal detection circuit may include, for example, a voltage application section 101, the MR element 3, a resistance change detector 102, and a signal processor 103. The voltage application section 101 and the resistance change detector 102 may be coupled to the MR element 3. The signal processor 103 may be coupled to the resistance change detector 102.

[Detailed Configuration of Magnetic Field Detection Device 10]

A description is given next of a detailed positional relationship between the soft magnetic layer 1 and the MR element 3 and between the soft magnetic layer 2 and the MR element 3. Here, a distance from a position XP1 of the center point 341 of the magnetization free layer 34 in the X-axis direction to a position XP2 of the edge EG11 in the X-axis direction is defined as a distance X11. A distance from the position XP1 of the center point 341 to a position XP3 of the edge EG12 in the X-axis direction is defined as a distance X12. For example, the distance X11 may be smaller than the distance X12 in one embodiment. Further, a distance from a position ZP1 of the center point 341 of the magnetization free layer 34 in the Z-axis direction to a position ZP2 of the edge EG11 in the Z-axis direction is defined as a distance Z11. A distance from the position ZP1 of the center point 341 to a position ZP3 of the edge EG12 in the Z-axis direction is defined as a distance Z12. For example, the distance Z11 may be smaller than the distance Z12 in one embodiment.

A distance X21 from the position XP1 of the center point 341 to a position XP4 of the edge EG21 in the X-axis direction may be smaller than a distance X22 from the position XP1 of the center point 341 to a position XP5 of the edge EG22 in the X-axis direction. A distance Z21 from the position ZP1 of the center point 341 to a position ZP4 of the edge EG21 in the Z-axis direction may be smaller than a distance Z22 from the position ZP1 of the center point 341 to a position ZP5 of the edge EG22 in the Z-axis direction. Further, a spacing D1 between the position XP2 of the edge EG11 in the X-axis direction and the position XP4 of the edge EG21 in the X-axis direction may be narrower than a spacing D2 between the position XP3 of the edge EG12 in the X-axis direction and the position XP5 of the edge EG22 in the X-axis direction.

Moreover, for example, a thickness T1 of the soft magnetic layer 1 and a thickness T2 of the soft magnetic layer 2 may be substantially equal to each other in one embodiment. For example, a position of the principal surface 11 in the Z-axis direction and a position of the principal surface 21 in the Z-axis direction may be substantially coincident with each other in one embodiment. A position of the principal surface 12 in the Z-axis direction and a position of the principal surface 22 in the Z-axis direction may be substantially coincident with each other in one embodiment.

[Workings and Effects of Magnetic Field Detection Device 10]

In the magnetic field detection device 10, an output corresponding to the external magnetic field that reaches the magnetic field detection device 10 is obtained by the signal detection circuit illustrated in FIG. 2. In a specific but non-limiting example, the voltage application section 101 applies a predetermined voltage between the bottom electrode layer 4 and the top electrode layer 5 in the above-described signal detection circuit to thereby cause a sense current to flow. The sense current corresponds to an electric resistance of the MR element 3 at that time. The electric resistance of the MR element 3 varies depending on a magnetization state of the MR element 3, i.e., depending on an orientation of the magnetization of the magnetization free layer 34 with respect to the orientation of the magnetization of the magnetization pinned layer 32. The sense current flowing through the MR element 3 is detected by the resistance change detector 102, and the resistance change detector 102 outputs a signal to the signal processor 103. Further, a signal generated in the signal processor 103 on the basis of the output from the resistance change detector 102 is outputted to the outside. This makes it possible to obtain, from the signal detection circuit, an output corresponding to the external magnetic field that reaches the magnetic field detection device 10.

In the magnetic field detection device 10 according to the present example embodiment, the MR element 3 includes the magnetization free layer 34 disposed at a position overlapped with the soft magnetic layer 1 in the X-axis direction. Here, the distance from the center point 341 of the magnetization free layer 34 to the edge EG11 of the soft magnetic layer 1 is set shorter than the distance from the center point 341 to the edge EG12 of the soft magnetic layer 1. In a specific but not-limiting example, the distance X11 from the position XP1 of the center point 341 in the X-axis direction to the position XP2 of the edge EG11 in the X-axis direction is set smaller than the distance X12 from the position XP1 of the center point 341 in the X-axis direction to the position XP3 of the edge EG12 in the X-axis direction. Further, the distance Z11 from the position ZP1 of the center point 341 in the Z-axis direction to the position ZP2 of the edge EG11 in the Z-axis direction is set smaller than the distance Z12 from the position ZP1 of the center point 341 in the Z-axis direction to the position ZP3 of the edge EG12 in the Z-axis direction. Adopting such a configuration enables the magnetic field detection device 10 to efficiently concentrate a magnetic flux on the magnetization free layer 34 via the soft magnetic layer 1 and the soft magnetic layer 2. As a result, application of an external magnetic field along the X-axis direction to the magnetic field detection device 10, for example, makes it possible to efficiently concentrate the magnetic flux on the magnetization free layer 34. Thus, it is possible for the magnetic field detection device 10 to exert a high magnetic field detection performance.

Moreover, the soft magnetic layer 1 and the soft magnetic layer 2 may each have an overhang shape; the inclined surface 13 and the inclined surface 23 may be each an inverted tapered surface that so extends as to overhang the MR element 3 as being toward the top electrode layer 5 from the bottom electrode layer 4 as the base. Accordingly, upon manufacturing of the magnetic field detection device 10, the soft magnetic layer 1 and the soft magnetic layer 2 may be formed, respectively, on both adjacent sides of the MR element 3 in the X-axis direction after stacking of the MR element 3 on the bottom electrode layer 4 as the base. Thus, it is easier to manufacture the MR element 3 than a case of forming the MR element 3 between the soft magnetic layer 1 and the soft magnetic layer 2 after formation thereof, for example. In addition, it is advantageous to enhance uniformity in a film quality and a thickness of each of layers that configure the MR element 3. In particular, a part of the soft magnetic layer 1 is designed to overlap a part of the MR element 3 (i.e., a part of the magnetization free layer 34 described later) in the thickness direction. This enables both the distance from the magnetization free layer 34 to the edge EG11 of the soft magnetic layer 1 and the distance from the magnetization free layer 34 to the edge EG21 of the soft magnetic layer 2 to be shorter. Accordingly, a magnetic flux having higher density reaches the magnetization free layer 34, thus making it possible for the magnetic field detection device 10 to exert a higher magnetic field detection performance.

2. Second Example Embodiment

Figure 3:
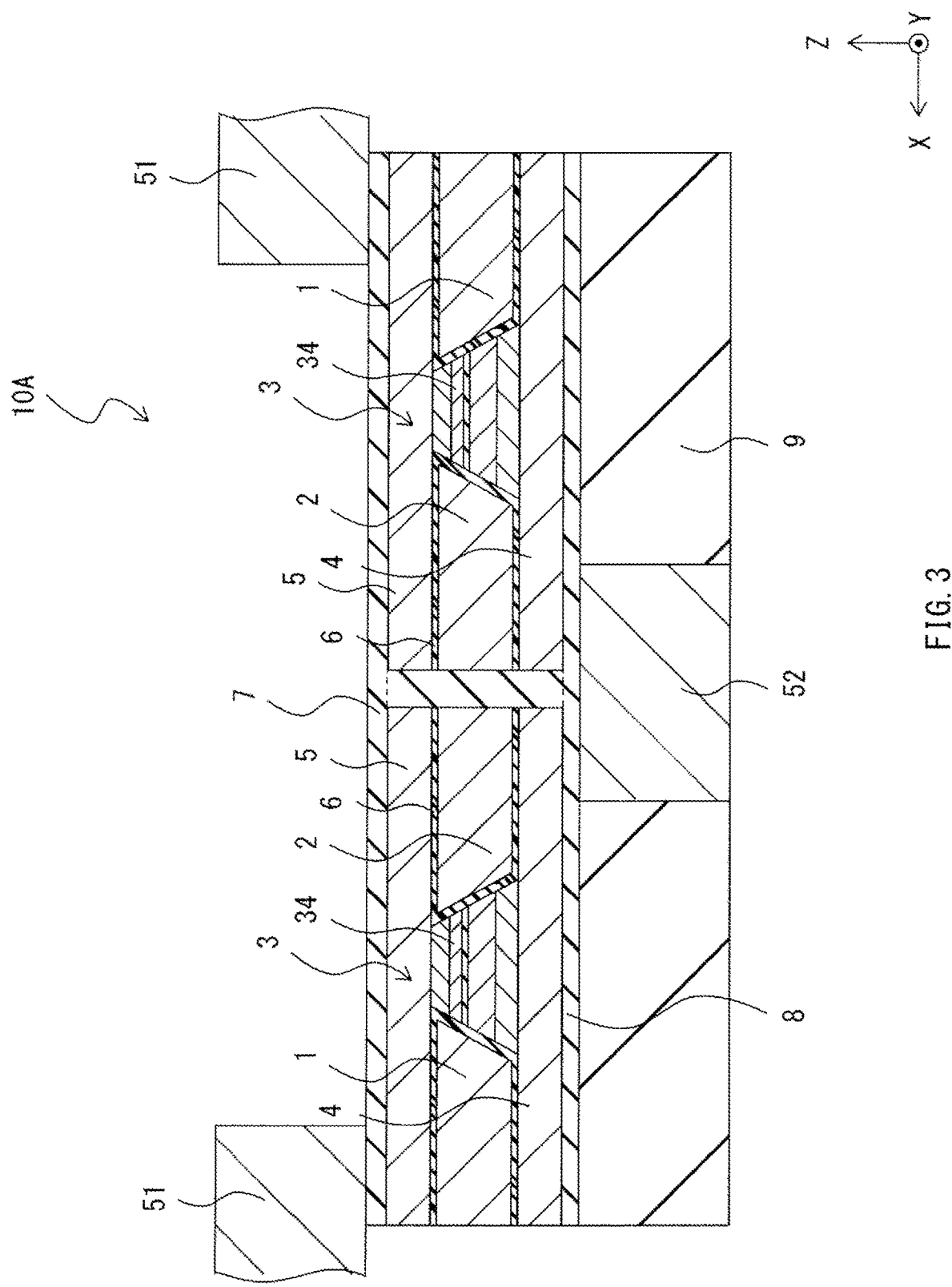
FIG. 3 is a schematic cross-sectional view of an overall configuration of a magnetic field detection device according to one example embodiment of the disclosure.

A description is given next of a magnetic field detection device 10A according to a second example embodiment of the disclosure, with reference to FIG. 3. FIG. 3 is a schematic cross-sectional view of an overall configuration example of the magnetic field detection device 10A.

The magnetic field detection device 10A according to the present example embodiment has a configuration substantially similar to that of the magnetic field detection device 10 of the foregoing first example embodiment, except that a soft magnetic layer 51 and a soft magnetic layer 52 are further provided. Therefore, in the following description, the above-mentioned difference is mainly described, and descriptions of substantially the same components as those of the magnetic field detection device 10 in the foregoing first example embodiment are omitted where appropriate.

In a specific but non-limiting example, in the magnetic field detection device 10A, the soft magnetic layer 51 may be disposed at a position overlapped with the soft magnetic layer 1 in the Z-axis direction, other than a position overlapped with the MR element 3 in the Z-axis direction, as illustrated in FIG. 3. The soft magnetic layer 51 may be stacked on the top electrode layer 5 with an insulating layer 7 being interposed therebetween. In the magnetic field detection device 10A, the soft magnetic layer 52 may be further disposed at a position overlapped with the soft magnetic layer 2 in the Z-axis direction, other than a position overlapped with the MR element 3 in the Z-axis direction. The soft magnetic layer 51 and the soft magnetic layer 52 may be positioned opposite to each other in the Z-axis direction, with the MR element 3 being interposed therebetween. The soft magnetic layer 52 may be provided below the bottom electrode layer 4, with an insulating layer 8 being interposed therebetween, and may be embedded inside a substrate 9, for example. It is to be noted that, in one embodiment, the MR element 3 and the soft magnetic layer 51 may be spaced apart from each other in the X-axis direction, and the MR element 3 and the soft magnetic layer 52 may be spaced apart from each other in the X-axis direction. Further, the soft magnetic layer 51 may be so provided as to be common to two adjacent MR elements 3, or one soft magnetic layer 51 may be provided for each MR element 3. The same holds true also for the soft magnetic layer 52.

In this manner, the magnetic field detection device 10A according to the present example embodiment may include the soft magnetic layer 51 provided obliquely above the MR element 3 and the soft magnetic layer 52 provided obliquely below the MR element 3. This makes it possible to converge the external magnetic field from a direction other than the X-axis direction in which the magnetization free layer 34 exhibits high sensitivity, and thus to guide a magnetic flux having higher density to the magnetization free layer 34. Thus, it becomes possible for the magnetic field detection device 10A to exert a higher magnetic field detection performance than that of the magnetic field detection device 10.

3. Other Modification Examples

The disclosure has been described hereinabove referring to some embodiments. However, the disclosure is not limited to such embodiments, and may be modified in a variety of ways. For example, FIGS. 1 and 3 each illustrate a case where the soft magnetic layer 1 and the soft magnetic layer 2 have substantially the same shape and the substantially same size; however, the soft magnetic layer 1 and the soft magnetic layer 2 may have different shapes and different sizes. Further, in the foregoing example embodiments, the position of the principal surface 11 in the Z-axis direction and the position of the principal surface 21 in the Z-axis direction are set coincident with each other; however, the position of the principal surface 11 and the position of the principal surface 21 may be different from each other in an embodiment of the disclosure. Likewise, in the foregoing example embodiments, the position of the principal surface 12 in the Z-axis direction and the position of the principal surface 22 in the Z-axis direction are set coincident with each other; however, the position of the principal surface 12 and the position of the principal surface 22 may be different from each other in the disclosure. Further, the magnetic field detection device of an embodiment of the disclosure may include only one of the soft magnetic layer 1 and the soft magnetic layer 2.

Figure 4:
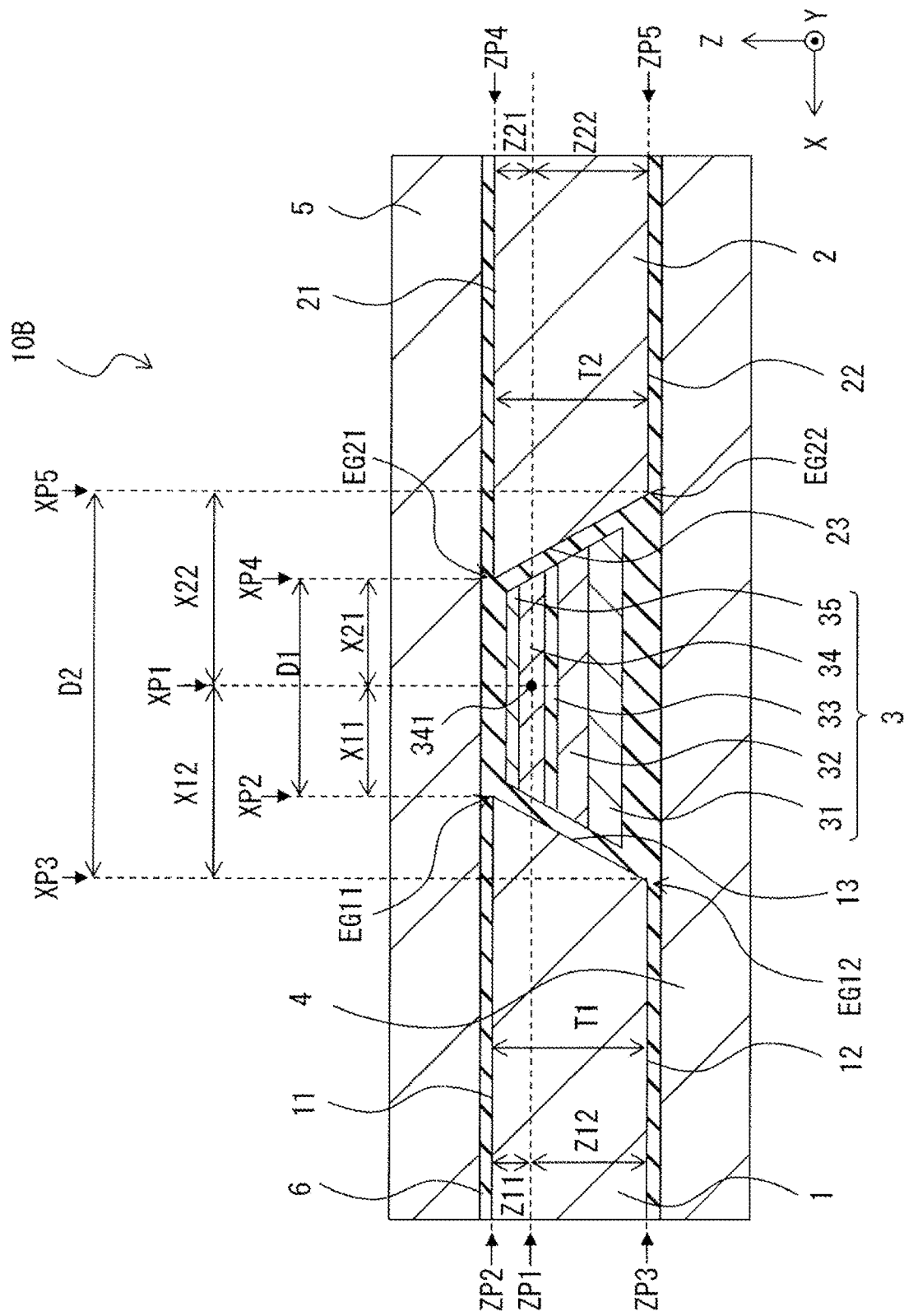
FIG. 4 is a schematic cross-sectional view of a magnetic field detection device according to a first modification example.
Figure 5:
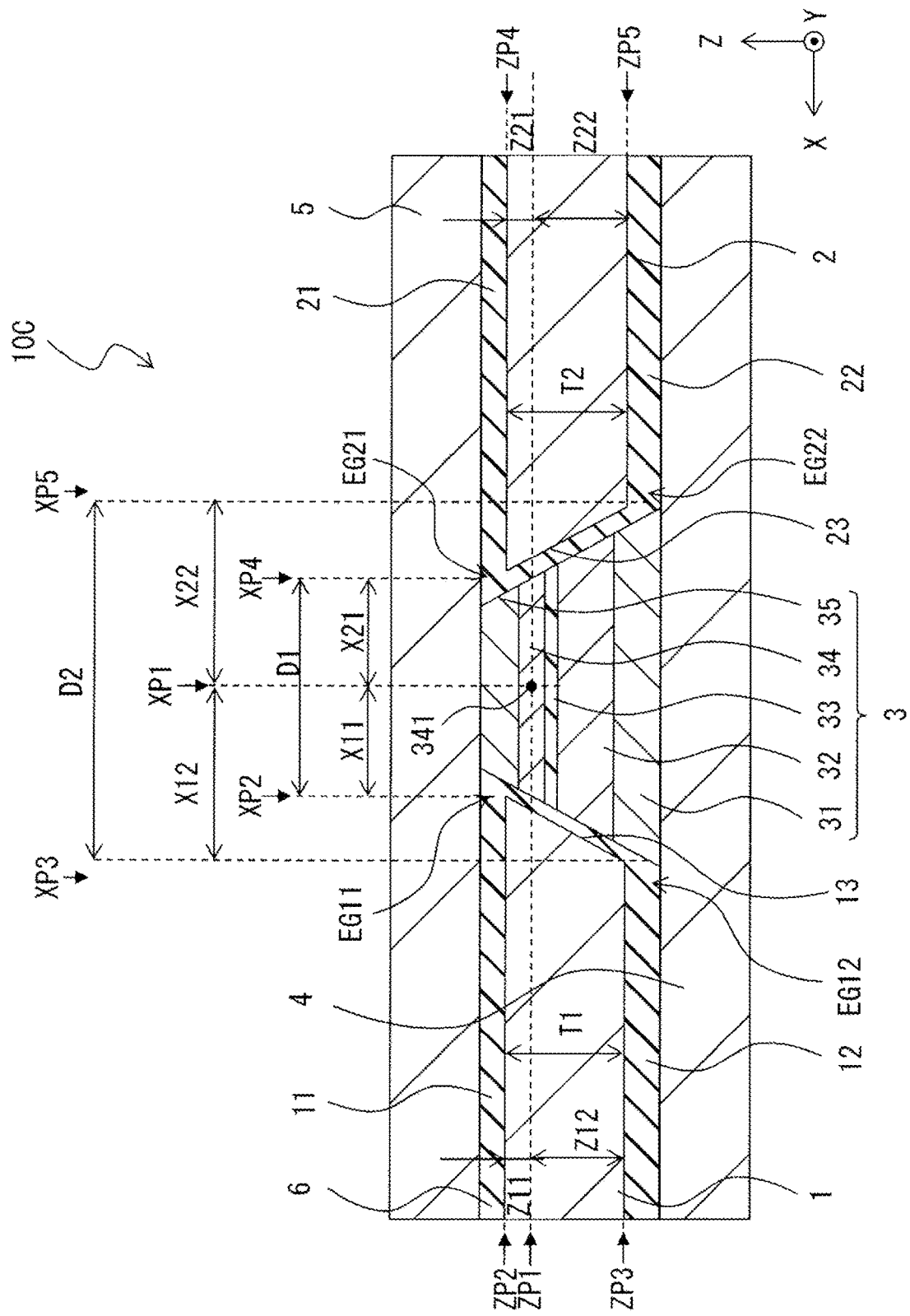
FIG. 5 is a schematic cross-sectional view of a magnetic field detection device according to a second modification example.
Figure 6:
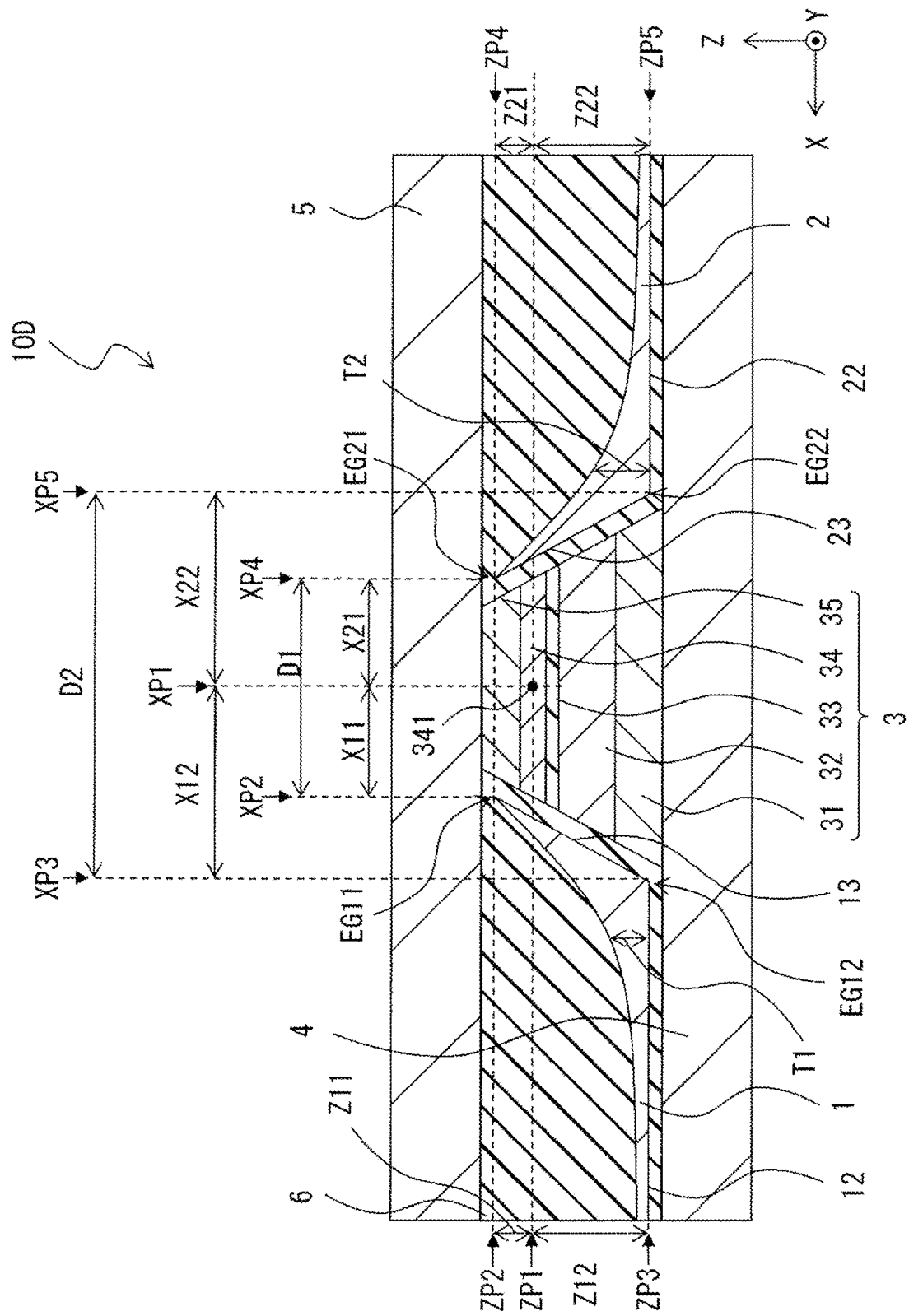
FIG. 6 is a schematic cross-sectional view of a magnetic field detection device according to a third modification example.

Further, FIGS. 1 and 3 each illustrate a case where the MR element 3, the soft magnetic layer 1, and the soft magnetic layer 2 have substantially the same thickness with one another; however, the disclosure is not limited thereto. For example, as in a magnetic field detection device 10B illustrated in FIG. 4, the thickness of the MR element 3 may be thinner than each of the thickness T1 of the soft magnetic layer 1 and the thickness T2 of the soft magnetic layer 2. In an alternative embodiment, the thickness of the MR element 3 may be larger than each of the thickness T1 of the soft magnetic layer 1 and the thickness T2 of the soft magnetic layer 2, as in a magnetic field detection device 10C illustrated in FIG. 5. Further, in the foregoing example embodiment, the soft magnetic layer 1 has the substantially constant thickness T1, and the soft magnetic layer 2 has the substantially constant thickness T2; however, the disclosure is not limited thereto. For example, as in a magnetic field detection device 10D illustrated in FIG. 6, the thickness T1 of the soft magnetic layer 1 and the thickness T2 of the soft magnetic layer 2 may each vary in the X-axis direction. In any case, it is sufficient for the magnetization free layer 34 to be disposed at a position overlapped with one or both of the soft magnetic layer 1 and the soft magnetic layer 2 in the X-axis direction.

The foregoing first example embodiment exemplifies the case where the magnetic field detection device 10 includes one soft magnetic layer 1, one soft magnetic layer 2, and one MR element 3. However, the disclosure may encompass a case where the magnetic field detection device 10 may include a plurality of soft magnetic layers 1, a plurality of soft magnetic layers 2, and a plurality of MR elements 3. Further, the foregoing second example embodiment exemplifies the case where the magnetic field detection device 10A includes two soft magnetic layers 1, two soft magnetic layers 2, and two MR elements 3. However, the disclosure may encompass a case where the magnetic field detection device 10A may include one soft magnetic layer 1, one soft magnetic layer 2, and one MR element 3.

Figure 7:
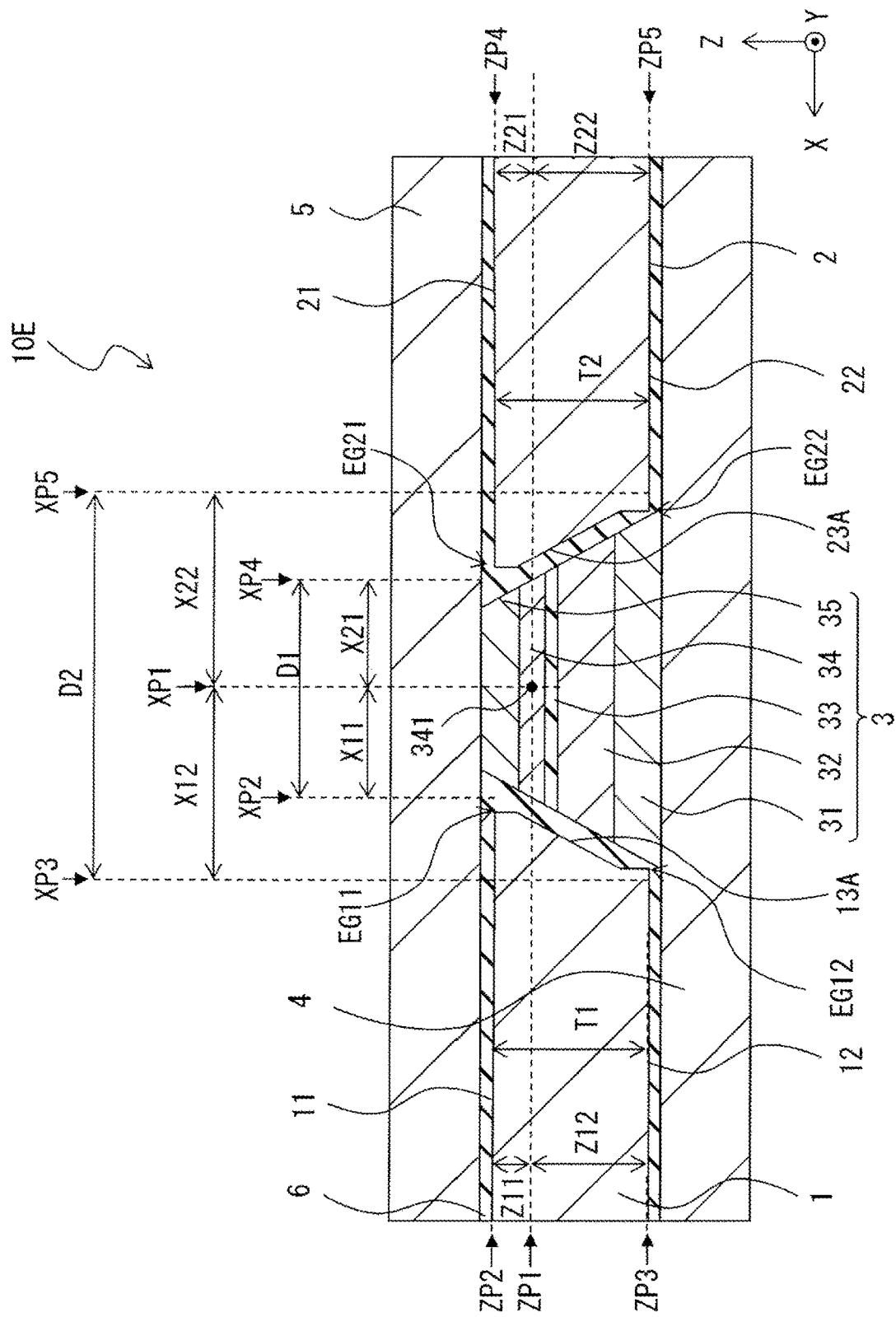
FIG. 7 is a schematic cross-sectional view of a magnetic field detection device according to a fourth modification example.

The foregoing example embodiments have exemplified and have described the inclined surface 13 and the inclined surface 23, respectively, as the specific but non-limiting example of the "first end surface" in an embodiment of the disclosure and as the specific but non-limiting example of the "second end surface" in an embodiment of the disclosure. The inclined surface 13 is inclined continuously from the edge EG11 to the edge EG12. The inclined surface 23 is inclined continuously from the edge EG21 to the edge EG22. However, the "first end surface" in an embodiment of the disclosure is not limited thereto; for example, an inverted tapered surface with only a part thereof being inclined relative to the first surface may be adopted. The same holds true also for the "second end surface" in an embodiment of the disclosure. In a specific but non-limiting example, for example, the disclosure may encompass a case where, as in a magnetic field detection device 10E illustrated in FIG. 7, an inclined surface 13A that is the inverted tapered surface is included in a part of the "first end surface" extending from the edge EG11 to the edge EG12, and an inclined surface 23A that is the inverted tapered surface is included in a part of the "second end surface" extending from the edge EG21 to the edge EG22.

In the magnetic field detection device 10A according to the foregoing second example embodiment, the soft magnetic layer 51 may be provided obliquely above the MR element 3, and the soft magnetic layer 52 may be provided obliquely below the MR element 3; however, the disclosure is not limited thereto. For example, the soft magnetic layer 52 may be provided obliquely below the MR element 3 without providing the soft magnetic layer 51. In an alternative embodiment, the soft magnetic layer 51 may be provided obliquely above the MR element 3 without providing the soft magnetic layer 52.

Further, in the magnetic field detection device 10A according to the foregoing second example embodiment, the soft magnetic layer 51 may be disposed at a position overlapped with the soft magnetic layer 1 in the Z-axis direction, other than a position overlapped with the MR element 3 in the Z-axis direction. However, the disclosure is not limited thereto; for example, it is sufficient for the soft magnetic layer 51 to be disposed at a position other than a position overlapped with the center point 341 (in FIG. 1, etc.) of the magnetization free layer 34 of the MR element 3 in the Z-axis direction. Accordingly, a part of the magnetization free layer 34 and the soft magnetic layer 51 may overlap each other in the Z-axis direction. Further, the soft magnetic layer 51 may be disposed at a position other than a position overlapped with the soft magnetic layer 1 in the Z-axis direction. The same holds true also for a positional relationship between the soft magnetic layer 52 and the MR element 3 as well as for a positional relationship between the soft magnetic layer 52 and the soft magnetic layer 2.

Figure 8:
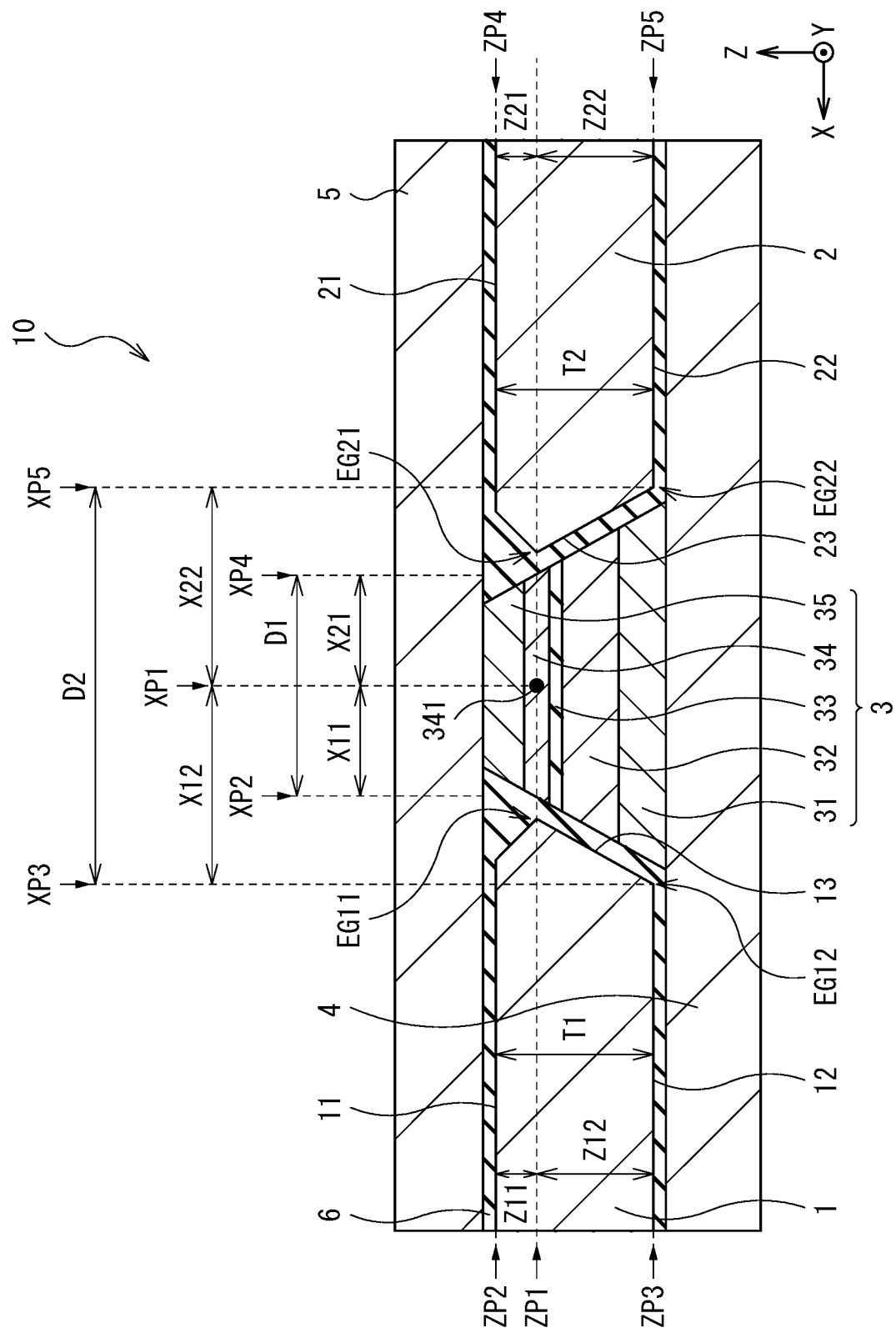
FIG. 8 is a schematic cross-sectional view of a magnetic field detection device according to a fifth modification example.

Embodiments of the technology also encompass a magnetic field detection device 10F illustrated in FIG. 8. Like the magnetic field detection device 10 illustrated in FIG. 1, the magnetic field detection device 10F of FIG. 8 includes the soft magnetic layer 1, the soft magnetic layer 2, the MR element 3, and the bottom electrode layer 4. The magnetic field detection device 10F may further include the top electrode layer 5 and the insulating layer 6. The insulating layer 6 may be provided between the soft magnetic layer 1 and the MR element 3, between the soft magnetic layer 1 and the bottom electrode layer 4, and between the soft magnetic layer 1 and the top electrode layer 5. In addition, the insulating layer 6 may be provided between the soft magnetic layer 2 and the MR element 3, between the soft magnetic layer 2 and the bottom electrode layer 4, and between the soft magnetic layer 2 and the top electrode layer 5. The MR element 3 is provided on the bottom electrode layer 4, and includes the magnetization free layer 34. The magnetization free layer 34 is disposed at a position overlapped with both the soft magnetic layer 1 and the second soft magnetic layer 2 in the X-axis direction along the X-Y plane. The MR element 3 has a magnetization sensing direction along the X-axis direction.

The soft magnetic layer 1 includes the principal surface 11 that extends along the X-Y plane, the principal surface 12 that extends parallel with the X-Y plane, and a first end surface that couples the principal surface 11 and the principal surface 12. The first end surface includes the inclined surface 13 inclined relative to the X-Y plane, and includes the edge EG11 serving as a first protruding portion protruding closer to the magnetization free layer 34 in the X-axis direction. The inclined surface 13 is an inverted tapered surface that extends closer to the center point 341 of the magnetization free layer 34 as being away from the bottom electrode layer 4 in the Z-axis direction orthogonal to the X-Y plane, and that is inclined relative to the X-Y plane. It is to be noted that a height position of the edge EG11 in the Z-axis direction may coincide with a height position of the magnetization free layer 34 in the Z-axis direction.

The soft magnetic layer 2 includes the principal surface 21 that extends along the X-Y plane, the principal surface 22 that extends parallel with the X-Y plane, and a second end surface that couples the principal surface 21 and the principal surface 22. The second end surface includes the inclined surface 23 inclined relative to the X-Y plane, and may include the edge EG21 serving as a second protruding portion protruding closer to the magnetization free layer 34 in the X-axis direction. The inclined surface 23 is an inverted tapered surface that extends closer to the center point 341 of the magnetization free layer 34 as being away from the bottom electrode layer 4 in the Z-axis direction orthogonal to the X-Y plane, and that is inclined relative to the X-Y plane. It is to be noted that a height position of the edge EG21 in the Z-axis direction may coincide with the height position of the magnetization free layer 34 in the Z-axis direction.

Descriptions have been given, in the foregoing embodiments, by exemplifying, as the magnetism detection element, the CPP MR element having the spin-valve structure; however, the disclosure is not limited thereto. For example, a CIP (current in plane) MR element or the magnetic tunneling junction element (MTJ element) may be used as the magnetism detection element. In an alternative embodiment, a sensor may also be used, such as a magnetism detection element (e.g., Hall element) having the sensing direction as the X-axis direction, other than the MR element.

Moreover, the disclosure encompasses any possible combination of some or all of the various embodiments and the modification examples described herein and incorporated herein.

It is possible to achieve at least the following configurations from the above-described example embodiments of the disclosure.

(1)

A magnetic field detection device including:

a base;

a first yoke provided on the base, the first yoke including a first principal surface that extends along a first plane, a second principal surface that extends along the first plane, and a first end surface that couples the first principal surface and the second principal surface; and a magneto-resistive effect element provided on the base, and including a magnetization free layer that is disposed at a position overlapped with the first yoke in a first direction along the first plane, the first end surface including an inverted tapered surface, the inverted tapered surface extending closer to a center point of the magnetization free layer as being away from the base in a second direction orthogonal to the first plane, and being inclined relative to the first plane, and a distance from the center point of the magnetization free layer to a first edge being shorter than a distance from the center point of the magnetization free layer to a second edge, the first edge being a location at which the first principal surface and the first end surface intersect each other, the second edge being a location at which the second principal surface and the first end surface intersect each other.

(2)

The magnetic field detection device according to (1), in which a first distance between a position of the center point of the magnetization free layer in the first direction and a position of the first edge in the first direction is smaller than a second distance between the position of the center point of the magnetization free layer in the first direction and a position of the second edge in the first direction, and a third distance between a position of the center point of the magnetization free layer in the second direction and a position of the first edge in the second direction is smaller than a fourth distance between the position of the center point of the magnetization free layer in the second direction and a position of the second edge in the second direction.

(3)

The magnetic field detection device according to (1) or (2), further including a second yoke disposed at a position that is positioned on side opposite to the first yoke in the first direction as viewed from the magneto-resistive effect element, and that is overlapped with the magnetization free layer in the first direction, the second yoke including a third principal surface that extends along the first plane, a fourth principal surface that extends along the first plane, and a second end surface that couples the third principal surface and the fourth principal surface, the second end surface including an inverted tapered surface, the inverted tapered surface extending closer to the center point of the magnetization free layer as being away from the base, and being inclined relative to the first plane, and a distance from the center point of the magnetization free layer to a third edge being shorter than a distance from the center point of the magnetization free layer to a fourth edge, the third edge being a location at which the third principal surface and the second end surface intersect each other, the fourth edge being a location at which the fourth principal surface and the second end surface intersect each other.

(4)

The magnetic field detection device according to (3), in which a fifth distance between a position of the center point of the magnetization free layer in the first direction and a position of the third edge in the first direction is smaller than a sixth distance between the position of the center point of the magnetization free layer in the first direction and a position of the fourth edge in the first direction, a seventh distance between a position of the center point of the magnetization free layer in the second direction and a position of the third edge in the second direction is smaller than an eighth distance between the position of the center point of the magnetization free layer in the second direction and a position of the fourth edge in the second direction, and a first spacing between the position of the first edge in the first direction and the position of the third edge in the first direction is narrower than a second spacing between the position of the second edge in the first direction and the position of the fourth edge in the first direction.

(5)

The magnetic field detection device according to (3) or (4), in which a thickness of the first yoke and a thickness of the second yoke are substantially same as each other.

(6)

The magnetic field detection device according to any one of (3) to (5), in which a position of the first principal surface in the second direction and a position of the third principal surface in the second direction are substantially coincident with each other, and a position of the second principal surface in the second direction and a position of the fourth principal surface in the second direction are substantially coincident with each other.

(7)

The magnetic field detection device according to any one of (3) to (6), in which the magnetization free layer is disposed at a position overlapped with both of a part of the first yoke and a part of the second yoke in the second direction.

(8)

The magnetic field detection device according to any one of (3) to (7), further including a third yoke that is disposed at a position other than a position overlapped with the center point of the magnetization free layer in the second direction.

(9)

The magnetic field detection device according to (8), in which the third yoke is disposed at the position overlapped with the first yoke in the second direction.

(10)

The magnetic field detection device according to (9), in which the magneto-resistive effect element and the third yoke are spaced apart from each other in the first direction.

(11)

The magnetic field detection device according to any one of (3) to (7), further including a third yoke and a fourth yoke that are each disposed at a position other than a position overlapped with the center point of the magnetization free layer in the second direction.

(12)

The magnetic field detection device according to (11), in which the third yoke is disposed at the position overlapped with the first yoke in the second direction, and the fourth yoke is disposed at a position overlapped with the second yoke in the second direction.

(13)

The magnetic field detection device according to (11) or (12), in which the third yoke and the fourth yoke are disposed at positions that are positioned on sides opposite to each other in the second direction, with the magneto-resistive effect element being interposed therebetween.

(14)

The magnetic field detection device according to any one of (11) to (13), in which the magneto-resistive effect element and the third yoke are spaced apart from each other in the first direction, and the magneto-resistive effect element and the fourth yoke are spaced apart from each other in the first direction.

(15)

The magnetic field detection device according to any one of (1) to (14), in which the magnetization free layer extends along the first plane.

In the magnetic field detection device according to one embodiment of the disclosure, adopting the above-described configuration makes it possible to effectively increase intensity of a magnetic field to be detected that reaches the magnetization free layer via the first yoke.

According to the magnetic field detection device of one embodiment of the disclosure, it is possible to improve intensity of a magnetic field to be detected that acts on the magnetization free layer in the magneto-resistive effect element. Thus, it is possible for the magnetic field detection device according to one embodiment of the disclosure to exert a superior magnetic field detection performance.

Although the disclosure has been described in terms of exemplary embodiments, it is not limited thereto. It should be appreciated that variations may be made in the described embodiments by persons skilled in the art without departing from the scope of the disclosure as defined by the following claims. The limitations in the claims are to be interpreted broadly based on the language employed in the claims and not limited to examples described in this specification or during the prosecution of the application, and the examples are to be construed as non-exclusive. For example, in this disclosure, the term "preferably", "preferred" or the like is non-exclusive and means "preferably", but not limited to. The use of the terms first, second, etc. do not denote any order or importance, but rather the terms first, second, etc. are used to distinguish one element from another. The term "substantially" and its variations are defined as being largely but not necessarily wholly what is specified as understood by one of ordinary skill in the art. The term "about" as used herein can allow for a degree of variability in a value or range. Moreover, no element or component in this disclosure is intended to be dedicated to the public regardless of whether the element or component is explicitly recited in the following claims.

What is claimed is:

1. A magnetic field detection device comprising:
a base;
a first yoke provided on the base, the first yoke including a first principal surface that extends along a first plane, a second principal surface that extends parallel with the first plane, and a first end surface that couples the first principal surface and the second principal surface;
a magneto-resistive effect element provided on the base, and including a magnetization free layer that is disposed at a position overlapped with the first yoke in a first direction along the first plane, the magneto-resistive effect element having a magnetization sensing direction along the first direction; and
a second yoke disposed at a position that is positioned on a side opposite to the first yoke in the first direction as viewed from the magneto-resistive effect element, and that is overlapped with the magnetization free layer in the first direction, the second yoke including a third principal surface that extends along the first plane, a fourth principal surface that extends parallel with the first plane, and a second end surface that couples the third principal surface and the fourth principal surface,
the first end surface including a first inverted tapered surface, the first inverted tapered surface extending closer to a center point of the magnetization free layer as being away from the base in a second direction orthogonal to the first plane, and being inclined relative to the first plane.

2. The magnetic field detection device according to claim 1, wherein
the second end surface including a second inverted tapered surface, the second inverted tapered surface extending closer to the center point of the magnetization free layer as being away from the base in the second direction, and being inclined relative to the first plane.

3. The magnetic field detection device according to claim 1, wherein
a distance from the center point of the magnetization free layer to a first edge is shorter than a distance from the center point of the magnetization free layer to a second edge, the first edge being a location at which the first principal surface and the first end surface intersect each other, the second edge being a location at which the second principal surface and the first end surface intersect each other, and
a distance from the center point of the magnetization free layer to a third edge is shorter than a distance from the center point of the magnetization free layer to a fourth edge, the third edge being a location at which the third principal surface and the second end surface intersect each other, the fourth edge being a location at which the fourth principal surface and the second end surface intersect each other.

4. The magnetic field detection device according to claim 1, further comprising an insulating layer provided between the magneto-resistive effect element and the first yoke, and between the magneto-resistive effect element and the second yoke.

5. The magnetic field detection device according to claim 1, wherein a thickness of the first yoke and a thickness of the second yoke are substantially same as each other.

6. A magnetic field detection device comprising:
a base;
a first magnetic body provided on the base, the first magnetic body including a first principal surface that extends along a first plane, a second principal surface that extends parallel with the first plane, and a first end surface that couples the first principal surface and the second principal surface;
a magneto-resistive effect element provided on the base, and including a magnetization free layer that is disposed at a position overlapped with the first magnetic body in a first direction along the first plane, the magneto-resistive effect element having a magnetization sensing direction along the first direction; and
a second magnetic body disposed at a position that is positioned on a side opposite to the first magnetic body in the first direction as viewed from the magneto-resistive effect element, and that is overlapped with the magnetization free layer in the first direction, the second magnetic body including a third principal surface that extends along the first plane, a fourth principal surface that extends parallel with the first plane, and a second end surface that couples the third principal surface and the fourth principal surface,
the first end surface including a first inverted tapered surface, the first inverted tapered surface extending closer to a center point of the magnetization free layer as being away from the base in a second direction orthogonal to the first plane, and being inclined relative to the first plane, and
the second end surface including a second inverted tapered surface, the second inverted tapered surface extending closer to the center point of the magnetization free layer as being away from the base in the second direction, and being inclined relative to the first plane.

7. A magnetic field detection device comprising:
a base;
a first yoke provided on the base, the first yoke including a first principal surface that extends along a first plane, a second principal surface that extends parallel with the first plane, and a first end surface that couples the first principal surface and the second principal surface;
a magneto-resistive effect element provided on the base, and including a magnetization free layer that is disposed at a position overlapped with the first yoke in a first direction along the first plane, the magneto-resistive effect element having a magnetization sensing direction along the first direction; and
a second yoke disposed at a position that is positioned on a side opposite to the first yoke in the first direction as viewed from the magneto-resistive effect element, and that is overlapped with the magnetization free layer in the first direction, the second yoke including a third principal surface that extends along the first plane, a fourth principal surface that extends parallel with the first plane, and a second end surface that couples the third principal surface and the fourth principal surface,
the first end surface including a first inverted tapered surface, the first inverted tapered surface extending closer to a center point of the magnetization free layer as being away from the base in a second direction orthogonal to the first plane, and being inclined relative to the first plane, and
the first end surface including a first closest portion, the first closest portion being located closest to the magnetization free layer in the first direction, the first closest portion being overlapped with the magnetization free layer in the first direction, the first closest portion being separated from the magnetization free layer and facing the magnetization free layer in the first direction.

8. The magnetic field detection device according to claim 7, wherein
the second end surface includes a second inverted tapered surface, the second inverted tapered surface extending closer to the center point of the magnetization free layer as being away from the base in the second direction, and being inclined relative to the first plane, and
the second end surface includes a second closest portion, the second closest portion being located closest to the magnetization free layer in the first direction, the second closest portion being overlapped with the magnetization free layer in the first direction, the second closest portion being separated from the magnetization free layer and facing the magnetization free layer in the first direction.

9. The magnetic field detection device according to claim 7, wherein
a distance from the center point of the magnetization free layer to a first edge is shorter than a distance from the center point of the magnetization free layer to a second edge, the first edge being a location at which the first principal surface and the first end surface intersect each other, the second edge being a location at which the second principal surface and the first end surface intersect each other, and
a distance from the center point of the magnetization free layer to a third edge is shorter than a distance from the center point of the magnetization free layer to a fourth edge, the third edge being a location at which the third principal surface and the second end surface intersect each other, the fourth edge being a location at which the fourth principal surface and the second end surface intersect each other.

10. A magnetic field detection device comprising:
a base;
a first yoke provided on the base, the first yoke including a first principal surface that extends along a first plane, a second principal surface that extends parallel with the first plane, and a first end surface that couples the first principal surface and the second principal surface;
a magneto-resistive effect element provided on the base, and including a magnetization free layer that is disposed at a position overlapped with the first yoke in a first direction along the first plane, the magneto-resistive effect element having a magnetization sensing direction along the first direction; and
a second yoke disposed at a position that is positioned on a side opposite to the first yoke in the first direction as viewed from the magneto-resistive effect element, and that is overlapped with the magnetization free layer in the first direction, the second yoke including a third principal surface that extends along the first plane, a fourth principal surface that extends parallel with the first plane, and a second end surface that couples the third principal surface and the fourth principal surface,
the first end surface including a first protruding portion, the first protruding portion protruding closer to the magnetization free layer in the first direction.

11. The magnetic field detection device according to claim 10, wherein the second end surface includes a second protruding portion, the second protruding portion protruding closer to the magnetization free layer in the first direction.

12. A magnetic field detection device comprising:
a base;
a first yoke and a second yoke provided on the base, each of the first yoke and the second yoke including a first principal surface that extends along a first plane, a second principal surface that extends parallel with the first plane, and an end surface that couples the first principal surface and the second principal surface; and
a magneto-resistive effect element provided on the base, located between the first yoke and the second yoke, and including a magnetization free layer that is disposed at a position overlapped with the first yoke and the second yoke in a first direction along the first plane, the magneto-resistive effect element having a magnetization sensing direction along the first direction,
the end surface including an inverted tapered surface, the inverted tapered surface extending closer to a center point of the magnetization free layer as being away from the base in a second direction orthogonal to the first plane, and being inclined relative to the first plane.

* * * * *